(12) United States Patent
Tanaka

(10) Patent No.: US 9,543,002 B2
(45) Date of Patent: Jan. 10, 2017

(54) NONVOLATILE SEMICONDUCTOR MEMORY DEVICE

(71) Applicant: Kabushiki Kaisha Toshiba, Minato-ku (JP)

(72) Inventor: Toshiharu Tanaka, Yokkaichi (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 14/840,312

(22) Filed: Aug. 31, 2015

(65) Prior Publication Data

US 2016/0267972 A1 Sep. 15, 2016

Related U.S. Application Data

(60) Provisional application No. 62/131,613, filed on Mar. 11, 2015.

(51) Int. Cl.
*H01L 27/24* (2006.01)
*H01L 23/528* (2006.01)
*G11C 13/00* (2006.01)

(52) U.S. Cl.
CPC ......... *G11C 13/0021* (2013.01); *H01L 27/249* (2013.01)

(58) Field of Classification Search
CPC ............... H01L 23/5226; H01L 23/528; H01L 23/5283; H01L 27/2454; H01L 27/2463; H01L 27/249; H01L 29/42372; H01L 29/42376; H01L 29/4238; G11C 13/0002; G11C 13/0021
See application file for complete search history.

(56) References Cited

U.S. PATENT DOCUMENTS

| | | | |
|---|---|---|---|
| 7,660,148 B2 | 2/2010 | Yokoi | |
| 7,995,374 B2 | 8/2011 | Komura et al. | |
| 8,289,793 B2 | 10/2012 | Kanda | |
| 8,891,277 B2 * | 11/2014 | Murooka | G11O 5/06 365/148 |
| 8,895,437 B2 * | 11/2014 | Cernea | H01L 27/249 257/208 |

(Continued)

FOREIGN PATENT DOCUMENTS

| | | |
|---|---|---|
| JP | 2008-269741 | 11/2008 |
| JP | 2010-93261 | 4/2010 |

(Continued)

*Primary Examiner* — Allison P Bernstein
(74) *Attorney, Agent, or Firm* — Oblon, McClelland, Maier & Neustadt, L.L.P.

(57) ABSTRACT

The transistor layer is disposed above or below the memory layer and includes a transistor. The wiring line layer connects the memory layer and the transistor layer. The memory cell array comprises a plurality of select gate lines connected to gates of a plurality of the select transistors aligned in a third direction. The wiring line layer comprises: a first connecting wiring line connected to a first select gate line of the plurality of select gate lines and extending in the third direction; and a second connecting wiring line connected to a second select gate line adjacent in a second direction to the first select gate line. This second connecting wiring line at least comprises: a first portion extending in the third direction; and a second portion extending from the first portion to a layer below the first connecting wiring line.

17 Claims, 14 Drawing Sheets

(56) References Cited

U.S. PATENT DOCUMENTS

2010/0096628 A1    4/2010  Song et al.
2016/0071908 A1*   3/2016  Murooka ............ H01L 27/2463
                                                          257/4

FOREIGN PATENT DOCUMENTS

JP          4881400      2/2012
JP          4901930      3/2012

* cited by examiner

NONVOLATILE SEMICONDUCTOR MEMORY DEVICE

CROSS REFERENCE TO RELATED APPLICATIONS

This application is based on and claims the benefit of priority from prior U.S. prior provisional Patent Application No. 62/131,613, filed on Mar. 11, 2015, the entire contents of which are incorporated herein by reference.

FIELD

Embodiments described below relate to a nonvolatile semiconductor memory device.

BACKGROUND

In recent years, there has been proposed a ReRAM (Resistive RAM) that utilizes as a memory a variable resistance element whose resistance value is reversibly changed. Moreover, in this ReRAM, a structure in which the variable resistance element is provided between a sidewall of a word line extending parallel to a substrate and a sidewall of a bit line extending perpendicularly to the substrate, is known. This structure has made possible an even higher degree of integration of a memory cell array. In the memory cell array of such a structure, a plurality of the bit lines are connected to one global bit line via a select transistor.

DETAILED DESCRIPTION

A nonvolatile semiconductor memory device according to an embodiment described below comprises: a memory layer including a memory cell array; a transistor layer including a transistor, the transistor being included in a control circuit that controls the memory cell array; and a wiring line layer that connects the memory layer and the transistor layer. The memory cell array comprises: a plurality of first wiring lines arranged in a first direction perpendicular to a principal plane of a substrate; a plurality of second wiring lines that are configured so as to extend in the first direction and that intersect the plurality of first wiring lines; a plurality of memory cells disposed at intersections of the plurality of first wiring lines and the plurality of second wiring lines, one memory cell including a variable resistance element; a third wiring line extending in a second direction, the second direction intersecting the first direction; a select transistor connected between the second wiring line and the third wiring line; and a plurality of select gate lines connected to gates of a plurality of the select transistors aligned in a third direction, the third direction intersecting the first direction and the second direction.

The wiring line layer comprises: a first connecting wiring line connected to a first select gate line of the plurality of select gate lines and extending in the third direction; and a second connecting wiring line connected to a second select gate line adjacent in the second direction to the first select gate line. This second connecting wiring line at least comprises: a first portion extending in the third direction; and a second portion extending from the first portion to a layer below the first connecting wiring line.

Each of embodiments will be described in detail below with reference to the drawings.

[First Embodiment]

First, a semiconductor memory device according to a first embodiment will be described with reference to FIGS. 1 to 13.

(Overall Configuration)

First, an overall configuration of the semiconductor memory device according to the first embodiment will be described.

Figure 1:
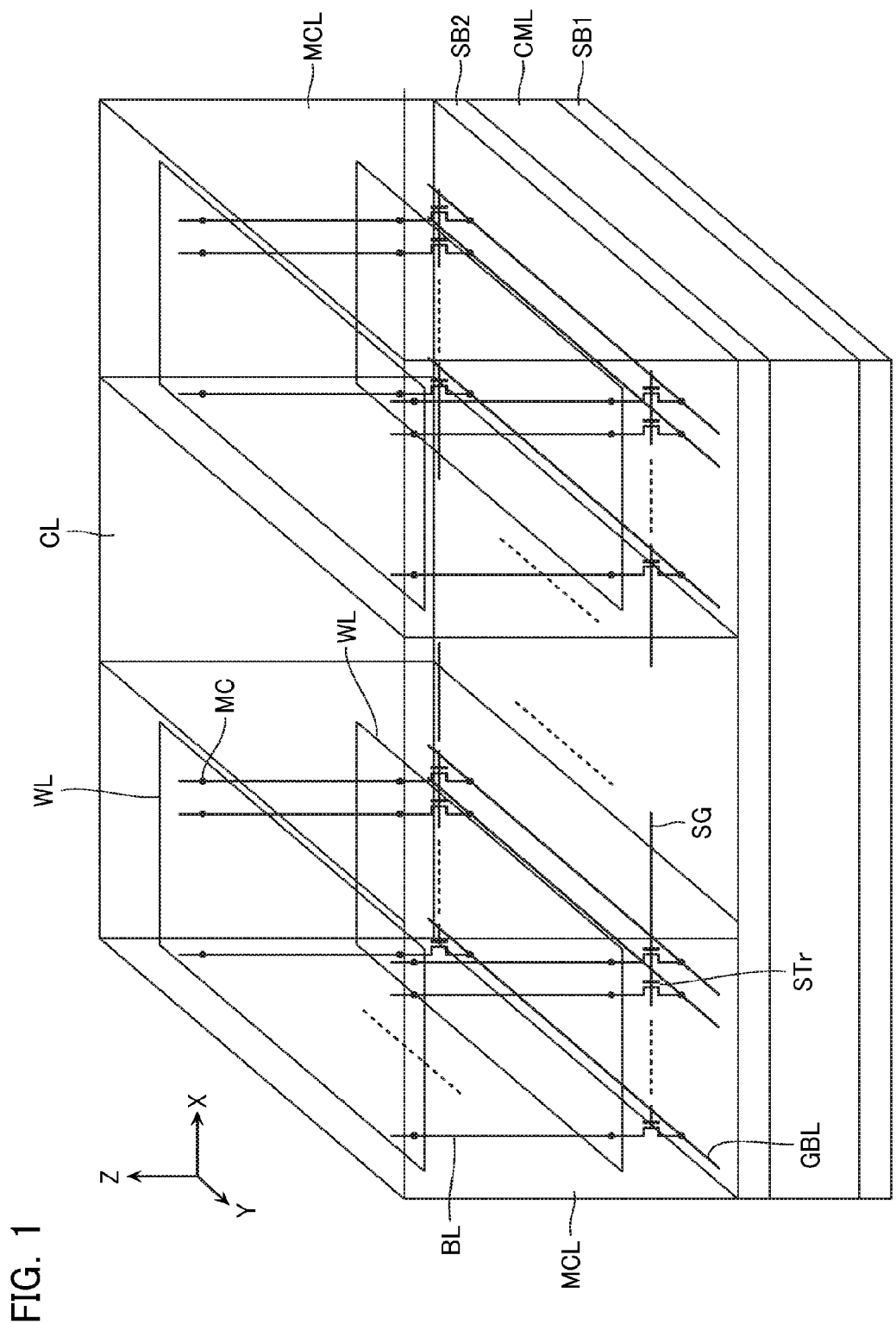
FIG. 1 is a schematic view showing an overall configuration of a semiconductor memory device according to a first embodiment.

FIG. 1 is a schematic view showing a schematic configuration of the semiconductor memory device according to the first embodiment.

This semiconductor memory device comprises: a first substrate SB1; and a transistor layer CML formed on this first substrate SB1. The transistor layer CML is a layer having formed therein a transistor for configuring various kinds of peripheral circuits for controlling a memory cell array.

Formed on this transistor layer CML, via a second substrate SB2, are a memory layer MCL and a wiring line layer CL. The memory layer MCL is a layer where a later-to-be-described memory cell array 11 is formed. As will be described in detail later, the memory layer MCL comprises global bit lines GBL in its lowermost layer, the global bit lines GBL extending in a Y direction of FIG. 1 and being arranged with a certain pitch in an X direction of FIG. 1. In addition, the memory layer MCL comprises a select transistor STr connected to this global bit line GBL. A plurality of the select transistors STr are connected to one global bit line GBL and are arranged in the Y direction. Therefore, in the memory layer MCL, a plurality of select transistors STr are disposed in a matrix above the lowermost layer global bit line GBL. Moreover, the plurality of select transistors STr aligned in the X direction are commonly connected to one select gate line SG.

Another end of the select transistor STr is connected to a bit line BL. The bit line BL is formed so as to extend having as its longer direction a Z direction (direction perpendicular to substrates SB1 and SB2) of FIG. 1. The bit lines BL also are disposed in a matrix in an XY plane corresponding to the select transistors STr.

Word lines WL are formed extending along the XY plane with a certain pitch in the Z direction. A memory cell MC is formed at an intersection of this word line WL and the bit line BL.

Note that in the example of FIG. 1, the transistor layer CML is positioned in a layer below the memory layer MCL, but this embodiment is not limited to this configuration, and it is also possible for the memory layer MCL to be positioned in a layer below the transistor layer CML.

(Circuit Diagram)

Figure 2:
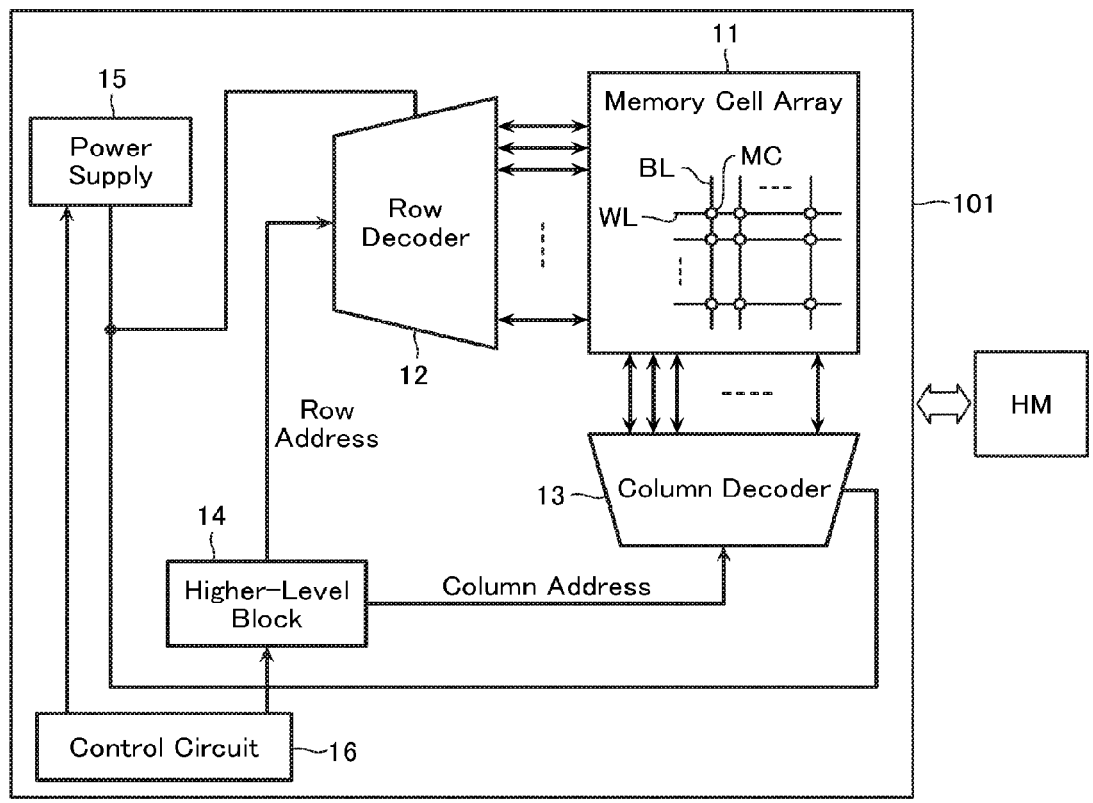
FIG. 2 is a block diagram of the semiconductor memory device according to the first embodiment.

FIG. 2 is a block diagram showing a circuit configuration of the semiconductor memory device according to the first embodiment. As shown in FIG. 2, a semiconductor memory device 101 includes: the memory cell array 11; a row decoder 12; a column decoder 13; a higher-level block 14; a power supply 15; and a control circuit 16.

As mentioned previously, the memory cell array 11 is disposed in the memory layer MCL and includes: a plurality of word lines WL and bit lines BL that intersect each other; and a memory cell MC disposed at each of intersections of these word lines WL and bit lines BL. The row decoder 12, the column decoder 13, the higher-level block 14, the power supply 15, the control circuit 16, and so on, are peripheral circuits, and a transistor configuring these peripheral circuits is formed in the previously mentioned transistor layer CML.

The row decoder 12 selects the word line WL during access (data erase/write/read). The column decoder 13 selects the bit line BL during access, and includes a driver that controls an access operation.

The higher-level block 14 selects the memory cell MC which is to be an access target in the memory cell array 11. The higher-level block 14 provides a row address and a column address to, respectively, the row decoder 12 and the column decoder 13. The power supply 15 generates certain combinations of voltages corresponding to each of operations of data erase/write/read, and supplies these combinations of voltages to the row decoder 12 and the column decoder 13. The control circuit 16 performs control of, for example, sending the addresses to the higher-level block 14, and, moreover, performs control of the power supply 15, based on a command from an external HM.

Figure 3:
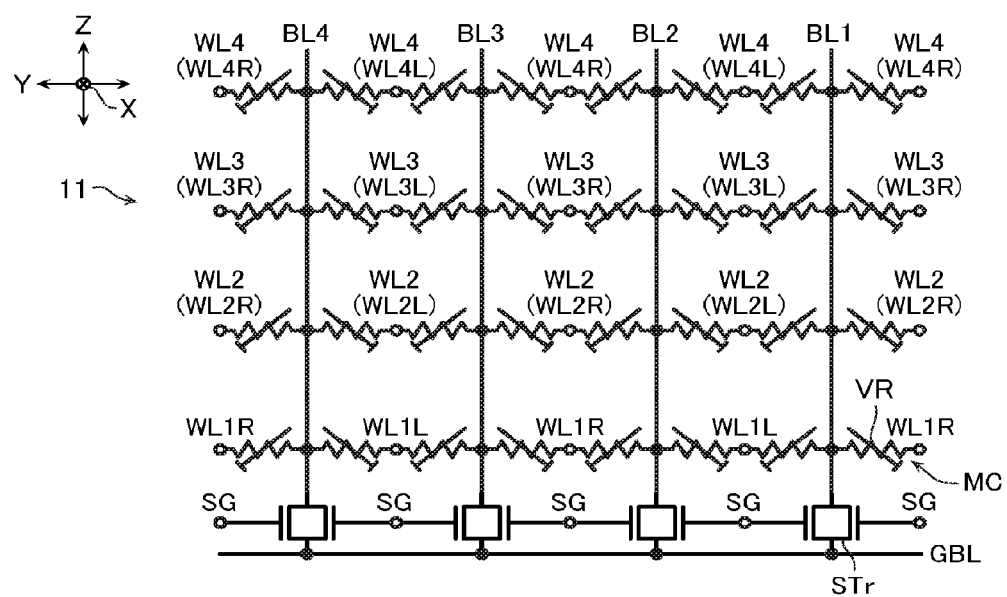
FIG. 3 is a circuit diagram of a memory cell array 11 according to the first embodiment.
Figure 4:
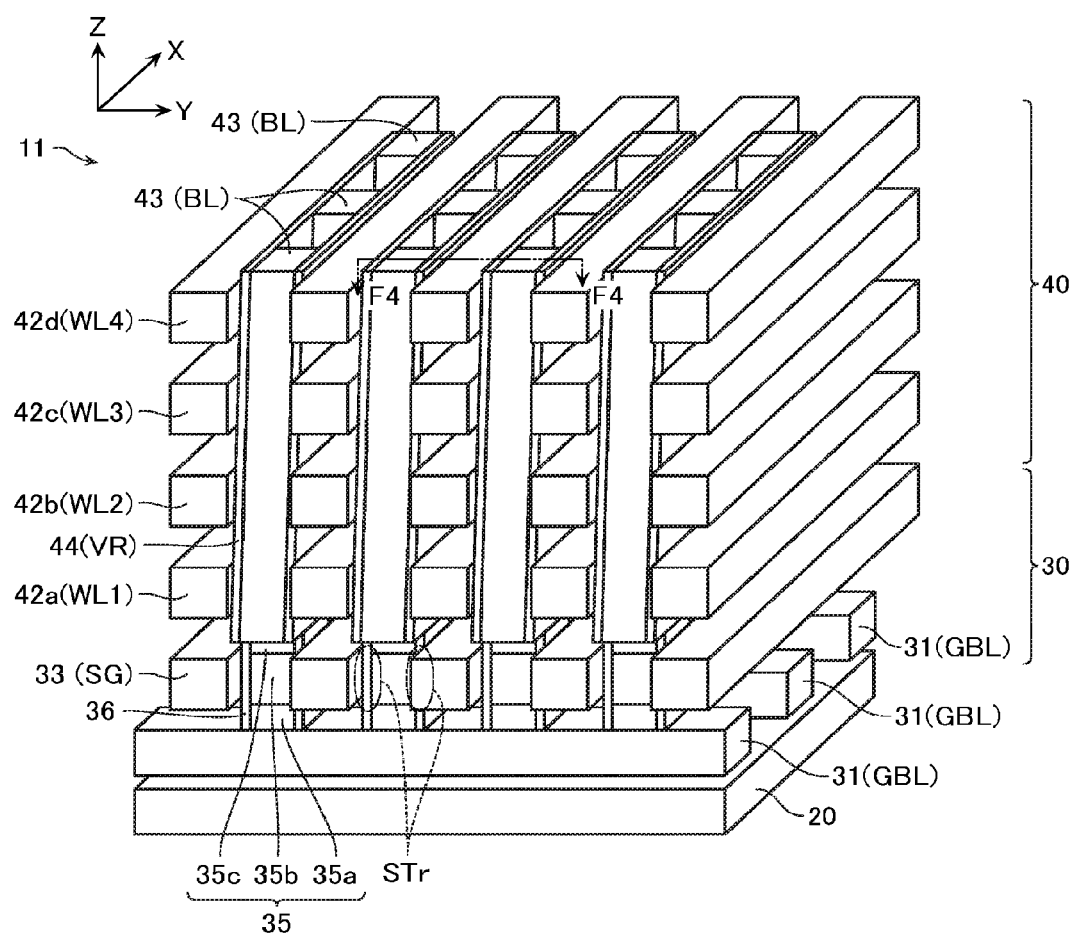
FIG. 4 is a perspective view showing a stacked structure of the memory cell array 11 according to the first embodiment.

Next, the memory cell array 11 according to the first embodiment will be described in detail with reference to FIGS. 3 and 4. FIG. 3 is an example of a circuit diagram of the memory cell array 11. FIG. 4 is an example of a perspective view showing a stacked structure of the memory cell array 11. Note that in FIG. 3, an X direction, a Y direction, and a Z direction are orthogonal to each other, and the X direction is a direction perpendicular to a plane of paper. In addition, a structure shown in FIG. 3 is provided repeatedly in the X direction.

As shown in FIG. 3, the memory cell array 11 includes the select transistor STr, the global bit line GBL, and the select gate line SG, in addition to the above-mentioned word line WL, bit line BL, and memory cell MC.

As shown in FIGS. 3 and 4, word lines WL1 to WL4 are arranged in the Z direction with a certain pitch, and extend in the X direction. The bit lines BL are arranged in a matrix in the X direction and the Y direction, and extend in the Z direction. The memory cells MC are disposed at places where these word lines WL and bit lines BL intersect. Therefore, the memory cells MC are arranged in a three-dimensional matrix in the X, Y, and Z directions.

As shown in FIG. 3, the memory cell MC includes a variable resistance element VR. A resistance value of the variable resistance element VR changes between a high-resistance state and a low-resistance state based on an applied voltage, whereby the memory cell MC stores data in a nonvolatile manner based on that resistance value. The variable resistance element VR changes from the high-resistance state (reset state) to the low-resistance state (set state) by a setting operation that applies a certain constant voltage or more to both ends of the variable resistance element VR, and changes from the low-resistance state (set state) to the high-resistance state (reset state) by a resetting operation that applies a certain constant voltage or more to both ends of the variable resistance element VR.

In addition, the variable resistance element VR, immediately after manufacturing, is in a state where its resistance state is not easily changed, and is in the high-resistance state. Accordingly, a forming operation is executed. In the forming operation, a high voltage greater than or equal to that of the setting operation and the resetting operation is applied to both ends of the variable resistance element VR. As a result of this forming operation, a region (filament path) where locally it is easy for a current to flow is formed in the variable resistance element VR, whereby the variable resistance element VR can have its resistance state changed easily, and achieves a state of being operable as a storage element.

As shown in FIG. 3, the select transistor STr is provided between the global bit line GBL and one end of the bit line BL. The global bit lines GBL are aligned with a certain pitch in the X direction, and extend in the Y direction. One global bit line GBL is commonly connected to one ends of a plurality of the select transistors STr arranged in a line in the Y direction.

In addition, as shown in FIGS. 3 and 4, two select transistors STr arranged adjacently in the Y direction can be commonly connected to one gate electrode (one gate electrode can be shared). The select gate lines SG are aligned with a certain pitch in the Y direction, and extend in the X direction. One select gate line SG is commonly connected to gates of a plurality of the select transistors STr arranged in a line in the X direction. Note that it is also possible to isolate gate electrodes of two select transistors STr arranged adjacently in the Y direction and thereby operate each of the two select transistors STr independently.

Figure 5:
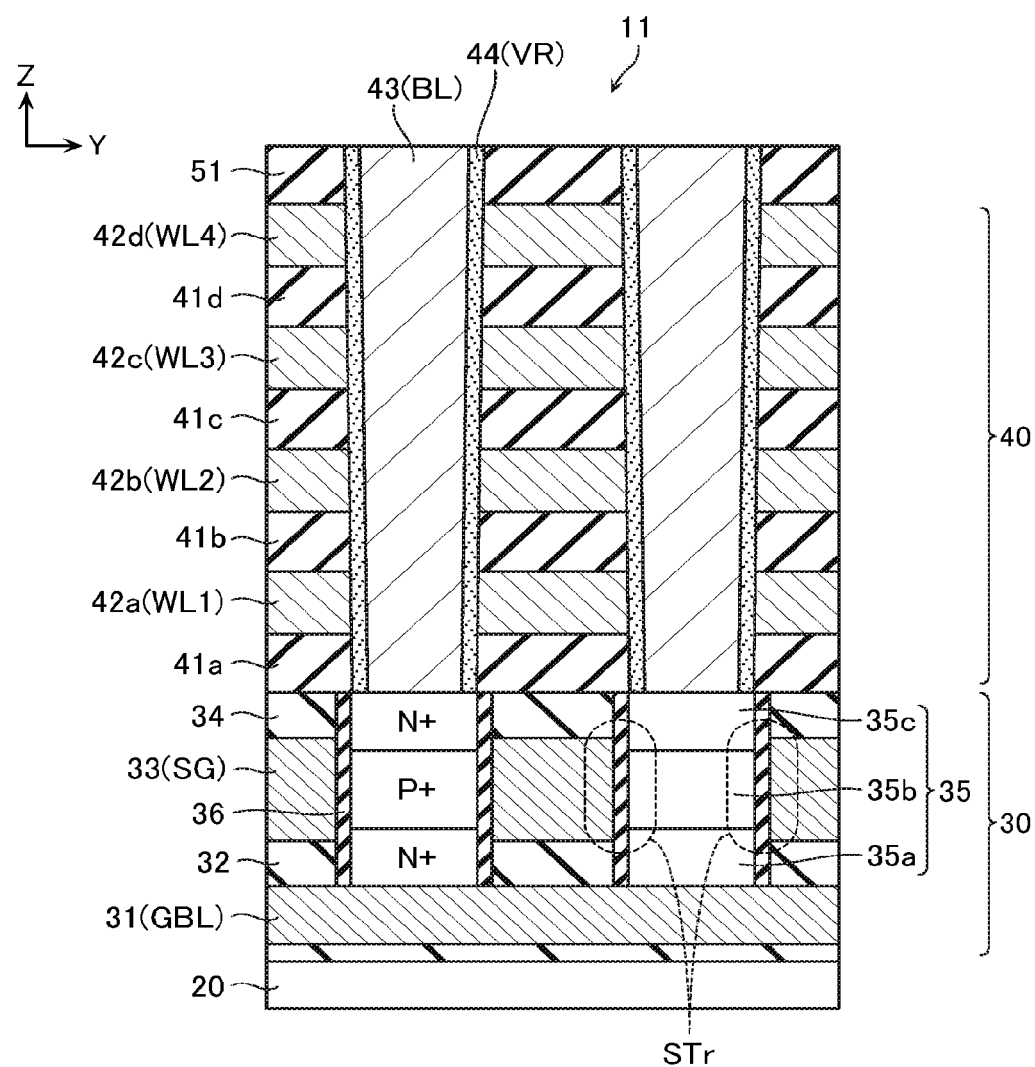
FIG. 5 is a cross-sectional view taken along the line F4-F4 of FIG. 4.
Figure 6:
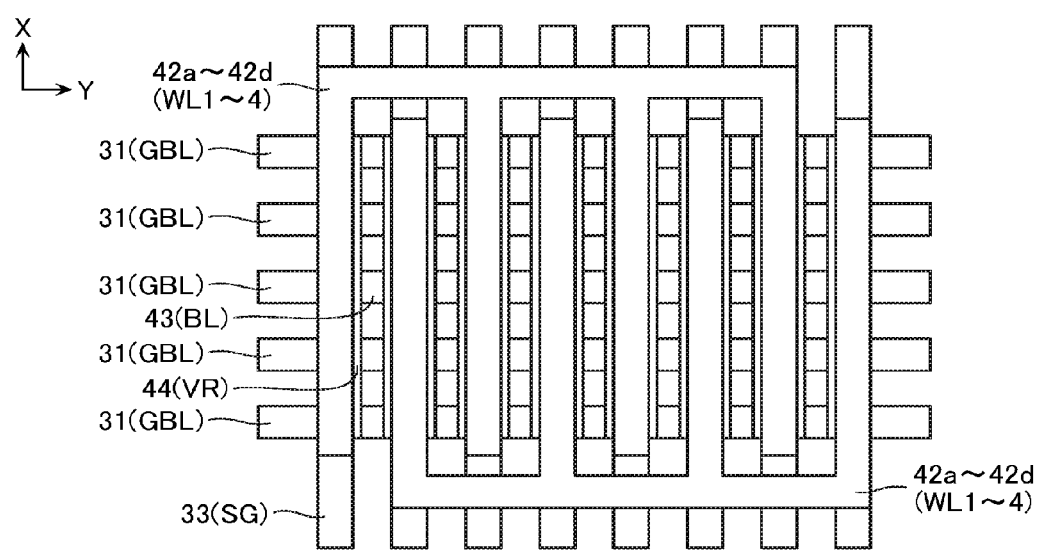
FIG. 6 is a top view of FIG. 3.

Next, the stacked structure of the memory cell array 11 according to the first embodiment will be described with reference to FIGS. 4, 5, and 6. FIG. 5 is an example of a cross-sectional view of an F4-F4 plane of FIG. 4; and FIG. 6 is an example of a top view of FIG. 4. Note that in FIGS. 4 and 6, illustration of an inter-layer insulating film is omitted.

As shown in FIGS. 4 and 5, the memory cell array 11 includes a select transistor layer 30 and a memory layer 40 that are stacked on a substrate 20. The select transistor layer 30 functions as the select transistor STr, and the memory layer 40 functions as the memory cell MC.

As shown in FIGS. 4 and 5, the select transistor layer 30 includes a conductive layer 31, an inter-layer insulating film 32, a conductive layer 33, and an inter-layer insulating film 34. These conductive layer 31, inter-layer insulating film 32, conductive layer 33, and inter-layer insulating film 34 are stacked sequentially in the Z direction perpendicular to the substrate 20. The conductive layer 31 functions as the global bit line GBL, and the conductive layer 33 functions as the select gate line SG and as the gate of the select transistor STr.

The conductive layers 31 are aligned with a certain pitch in the X direction parallel to the substrate 20, and have a striped shape extending in the Y direction (refer to FIG. 4). Although illustration thereof is omitted in FIG. 3, an inter-layer insulating film is formed between a plurality of the conductive layers 31.

The inter-layer insulating film 32 is formed so as to cover an upper surface of the conductive layer 31, and has a role of electrically insulating between the conductive layer 31 and the select gate line SG (conductive layer 33). The conductive layers 33 are aligned with a certain pitch in the Y direction, and are formed in a striped shape extending in the X direction (refer to FIG. 4). The inter-layer insulating film 34 is deposited so as to cover a side surface and an upper surface of the conductive layer 33. For example, the conductive layers 31 and 33 are configured by polysilicon. The inter-layer insulating films 32 and 34 are configured by silicon oxide ($SiO_2$).

In addition, as shown in FIGS. 4 and 5, the select transistor layer 30 includes, for example, a columnar semiconductor layer 35 and a gate insulating layer 36. The semiconductor layer 35 functions as a body (channel) of the select transistor STr, and the gate insulating layer 36 functions as a gate insulating film of the select transistor STr.

The semiconductor layers 35 are disposed in a matrix in the X and Y directions, and extend having the Z direction as their longer direction. In addition, the semiconductor layer 35 contacts the upper surface of the conductive layer 31, and contacts a side surface in the Y direction of the conductive layer 33 via the gate insulating layer 36. Moreover, the semiconductor layer 35 includes, stacked from below to above, an N+ type semiconductor layer 35a, a P+ type semiconductor layer 35b, and an N+ type semiconductor layer 35c.

As shown in FIG. 5, the N+ type semiconductor layer 35a contacts the inter-layer insulating film 32 via the gate insulating layer 36 at a side surface in the Y direction of the N+ type semiconductor layer 35a. The P+ type semiconductor layer 35b contacts a side surface of the conductive layer 33 via the gate insulating layer 36 at a side surface in the Y direction of the P+ type semiconductor layer 35b. The N+ type semiconductor layer 35c contacts the inter-layer insulating film 34 via the gate insulating layer 36 at a side surface in the Y direction of the N+ type semiconductor layer 35c. The N+ type semiconductor layers 35a and 35c are configured by polysilicon implanted with an N+ type impurity, and the P+ type semiconductor layer 35b is configured by polysilicon implanted with a P+ type impurity. The gate insulating layer 36 is configured by, for example, silicon oxide ($SiO_2$). Note that a barrier metal layer may be formed between the semiconductor layer 35 and a later-to-be-described conductive layer 43 and between the semiconductor layer 35 and the conductive layer 31 (illustration thereof is omitted in FIG. 5).

As shown in FIGS. 4 and 5, the memory layer 40 includes inter-layer insulating films 41a to 41d and conductive layers 42a to 42d stacked alternately in the Z direction. The conductive layers 42a to 42d function as the word lines WL1 to WL4, respectively. The conductive layers 42a to 42d, when viewed from the Z direction, include a pair of comb-tooth shapes facing each other in the X direction (refer to FIG. 6). That is, word lines WLiR (i=1 to 4) belonging to one of the pair of comb-tooth shaped conductive layers and word lines WLiL belonging to the other of the pair of comb-tooth shaped conductive layers, are formed alternately in the Y direction. Adopting this comb-tooth shaped conductive layer makes it possible to reduce the number of contacts connecting the word lines WL. Note that the inter-layer insulating films 41a to 41d are configured by, for example, silicon oxide ($SiO_2$), and the conductive layers 42a to 42d are configured by, for example, polysilicon.

In addition, as shown in FIGS. 4 and 5, the memory layer 40 includes, for example, a columnar conductive layer 43 and a variable resistance layer 44. The conductive layer 43 functions as the bit line BL. The variable resistance layer 44 functions as the variable resistance element VR.

The conductive layers 43 are disposed in a matrix in the X and Y directions, contact an upper surface of the semiconductor layer 35 at a lower end of the conductive layer 43, and extend in a columnar shape in the Z direction. Although illustration thereof is omitted in FIG. 4, an inter-layer insulating film is formed between the conductive layers 43 aligned in the X direction.

The variable resistance layer 44 is provided between a side surface in the Y direction of the conductive layer 43 and side surfaces in the Y direction of the inter-layer insulating films 41a to 41d. In addition, the variable resistance layer 44 is provided between the side surface in the Y direction of the conductive layer 43 and side surfaces in the Y direction of the conductive layers 42a to 42d. The conductive layer 43 is configured by, for example, polysilicon, and the variable resistance layer 44 is configured by, for example, a metal oxide (for example, $HfO_x$, $Al_2O_x$, $TiO_x$, $NiO_x$, $WO_x$, $Ta_2O_x$, and so on).

Next, a setting operation, a resetting operation, and a read operation in the nonvolatile semiconductor memory device having this kind of structure will be simply explained.

When executing the setting operation that changes a certain selected memory cell MC from the high-resistance state to the low-resistance state, a selected global bit line GBL corresponding to the bit line BL to which that memory cell MC is connected is applied with a certain setting voltage Vset, and the other unselected global bit lines GBL are applied with, for example, 0 V. In addition, a selected word line WL to which the selected memory cell MC is connected is applied with, for example, 0 V, while the other unselected word lines are applied with a voltage Vset/2 which is half of the setting voltage Vset. Moreover, the select transistor STr to which said bit line BL is connected is selectively rendered conductive, and the other select transistors are maintained in a non-conductive state. As a result, only the selected memory cell MC is applied with the setting voltage Vset, and the setting operation is performed.

Moreover, when executing the resetting operation that changes a certain selected memory cell MC from the low-resistance state to the high-resistance state, the selected global bit line GBL corresponding to the bit line BL to which that memory cell MC is connected is applied with a certain resetting voltage Vreset, and the other unselected global bit lines GBL are applied with, for example, 0 V.

In addition, the selected word line WL to which the selected memory cell MC is connected is applied with, for example, 0 V, while the other unselected word lines are applied with a voltage Vreset/2 which is half of the resetting voltage Vreset. Moreover, the select transistor STr to which said bit line BL is connected is selectively rendered conductive, and the other select transistors are maintained in a non-conductive state. As a result, only the selected memory cell MC is applied with the resetting voltage Vreset, and the resetting operation is performed.

In a read operation that reads a state of a memory cell, the selected global bit line GBL corresponding to the bit line BL to which that memory cell MC is connected is applied with a certain read voltage Vread, and the other unselected global bit lines GBL are applied with, for example, 0 V. In addition, the selected word line WL to which the selected memory cell MC is connected is applied with, for example, 0 V, while the other unselected word lines are applied with a voltage Vread/2 which is half of the read voltage Vread. Moreover, the select transistor STr to which said bit line BL is connected is selectively rendered conductive, and the other select transistors are maintained in a non-conductive state. As a result, only the selected memory cell MC is applied with the read voltage Vread, and the read operation is performed.

(Configuration of Wiring Line Layer CL)

Next, a structure of the wiring line layer CL will be described in detail with reference to FIGS. 7 to 11. This wiring line layer CL includes a wiring line and a contact for connecting the memory layer MCL and the transistor layer CML.

Figure 7:
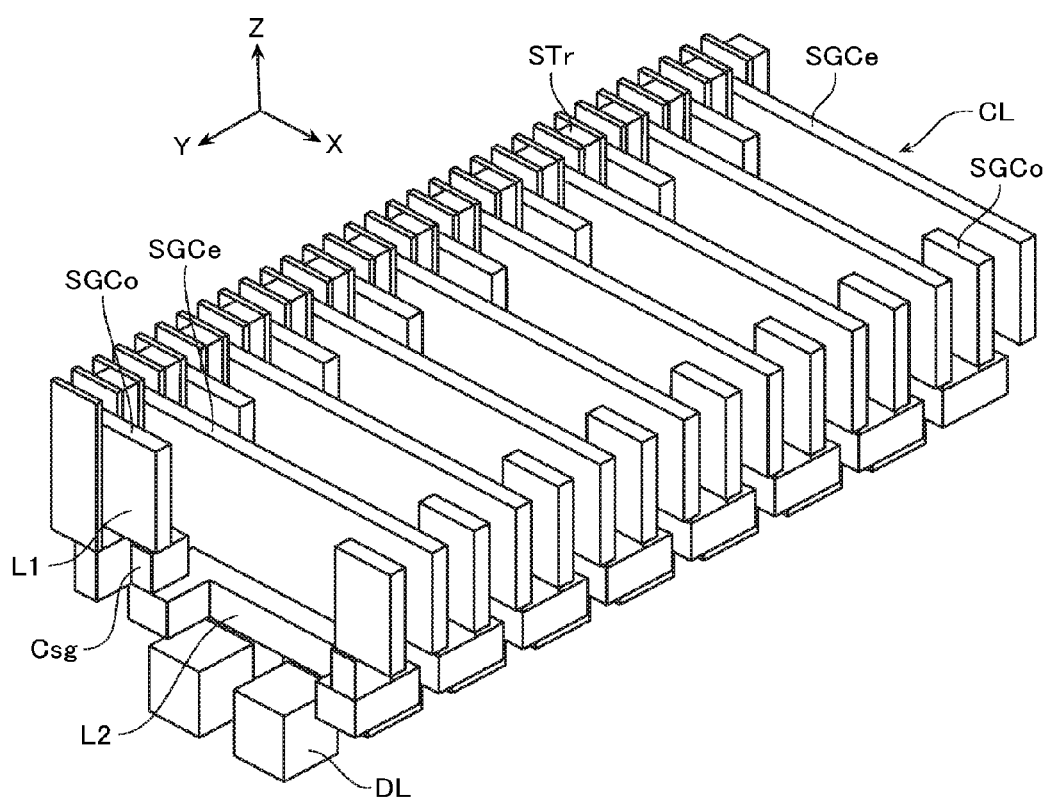
FIG. 7 is a perspective view showing a structure of a wiring line layer CL shown in FIG. 1.
Figure 8:
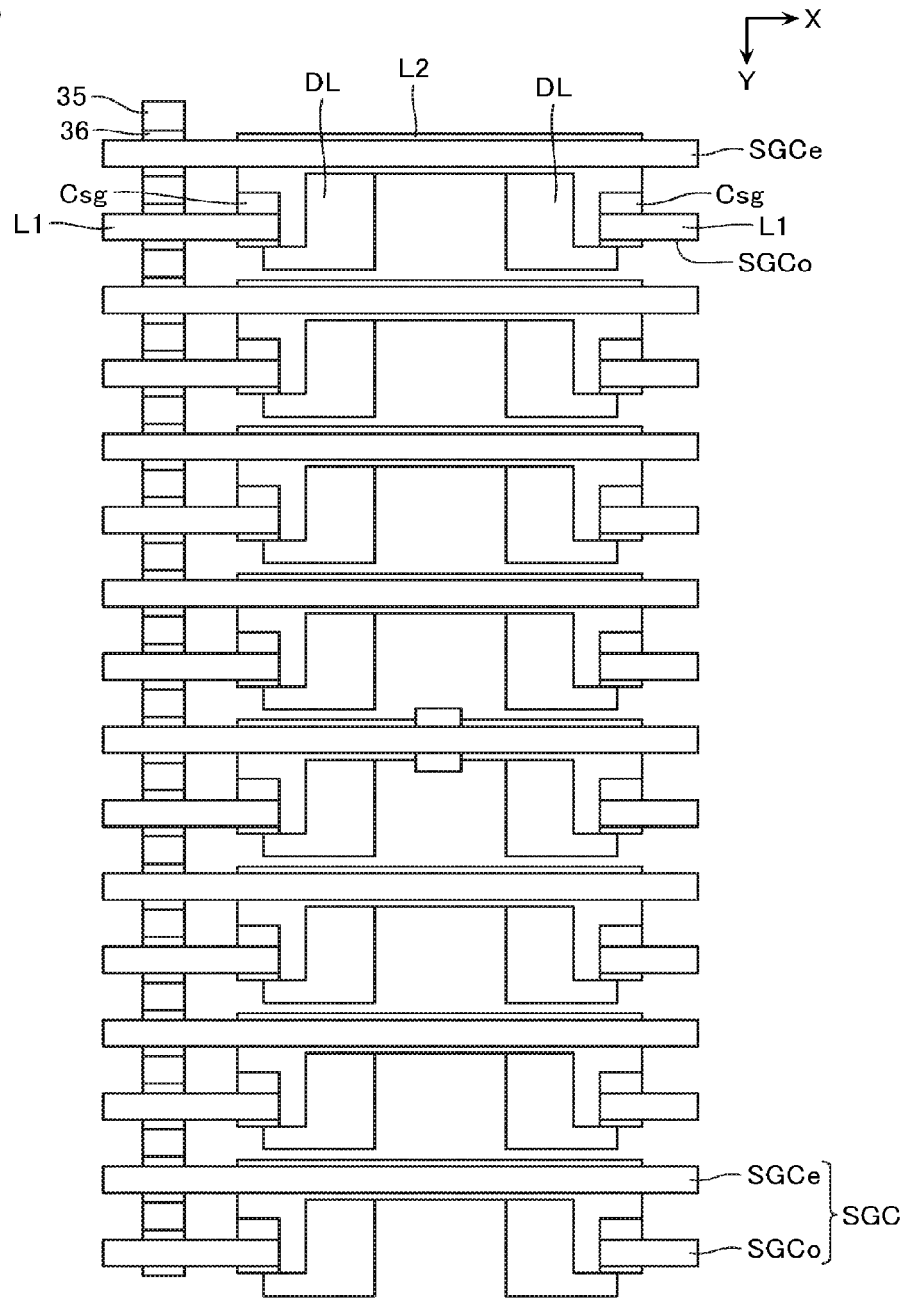
FIG. 8 is a plan view showing the structure of the wiring line layer CL.
Figure 9:
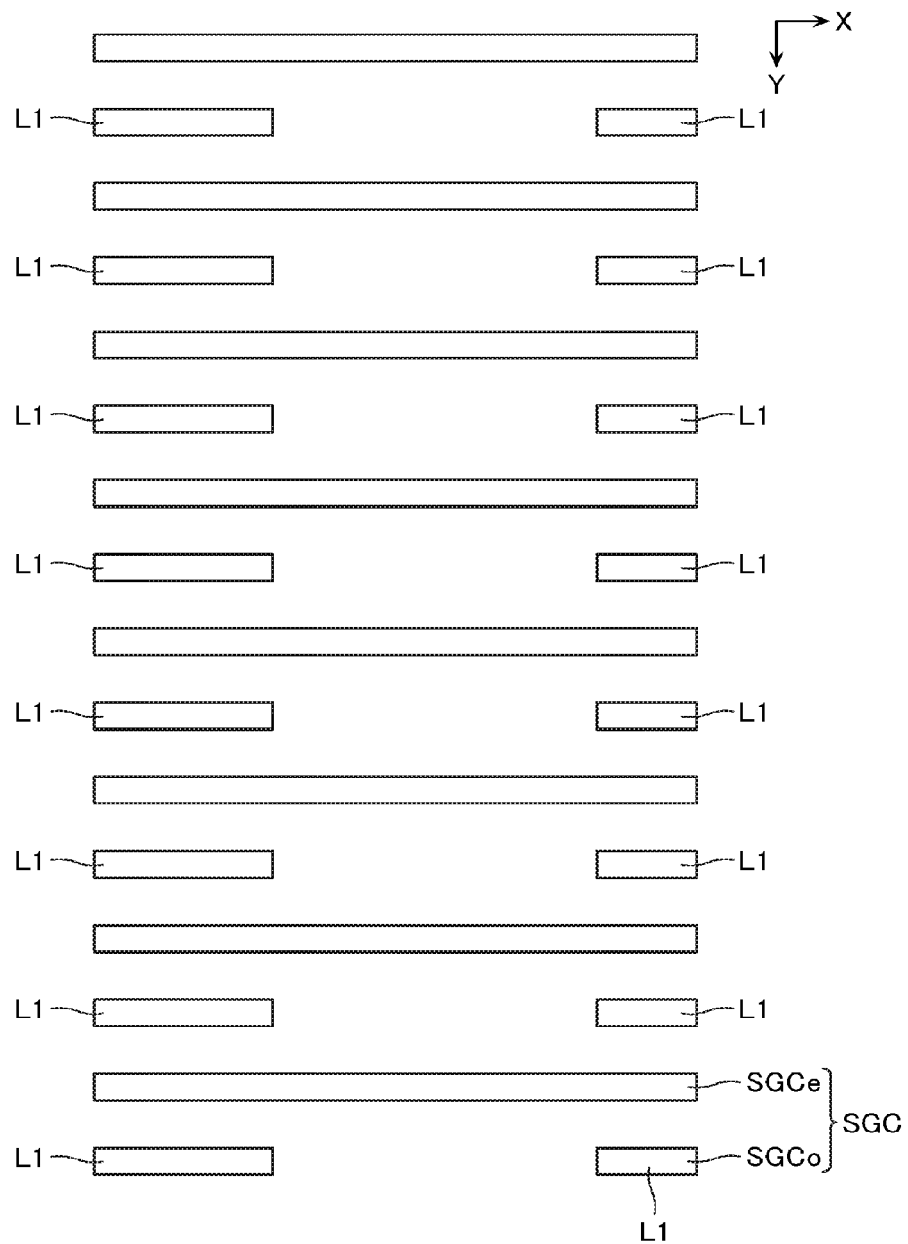
FIG. 9 is a cross-sectional view along an XY plane of the wiring line layer CL.
Figure 10:
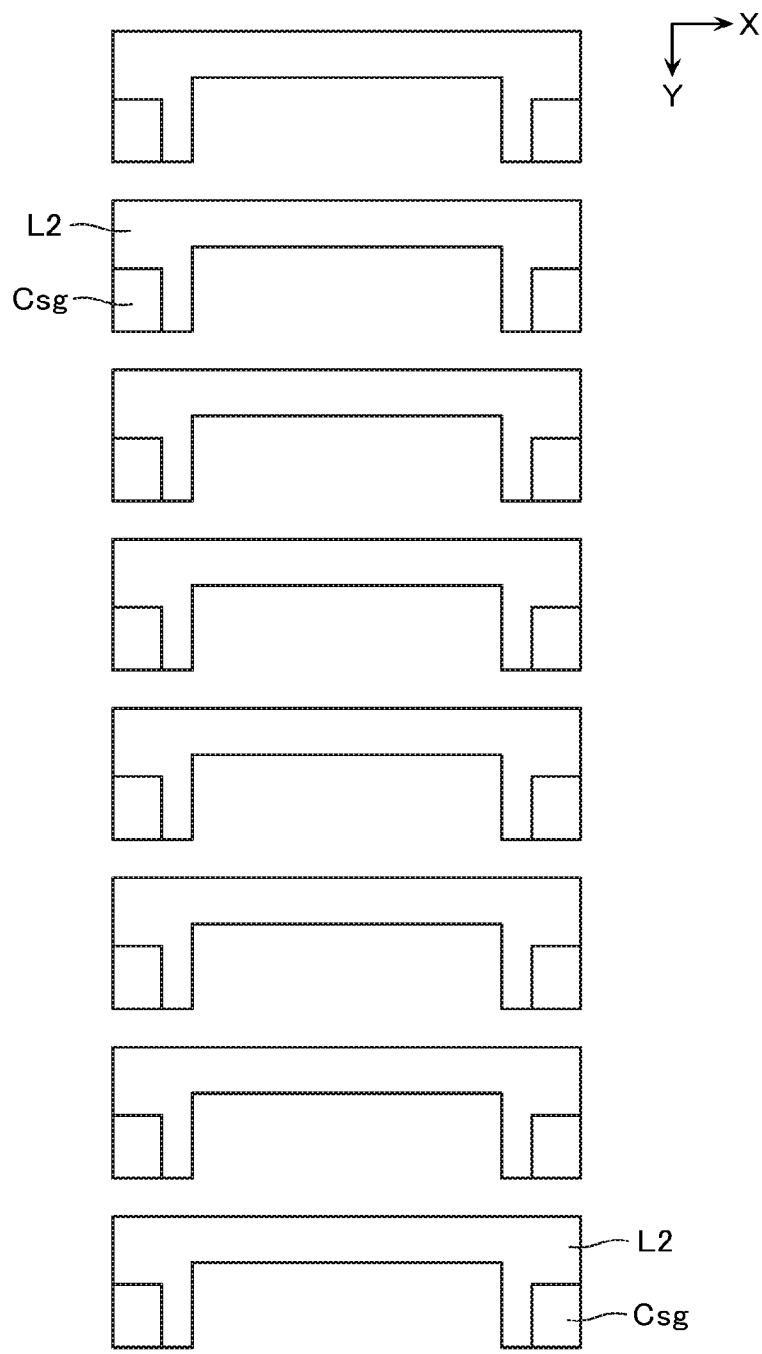
FIG. 10 is a cross-sectional view along an XY plane of the wiring line layer CL.
Figure 11:
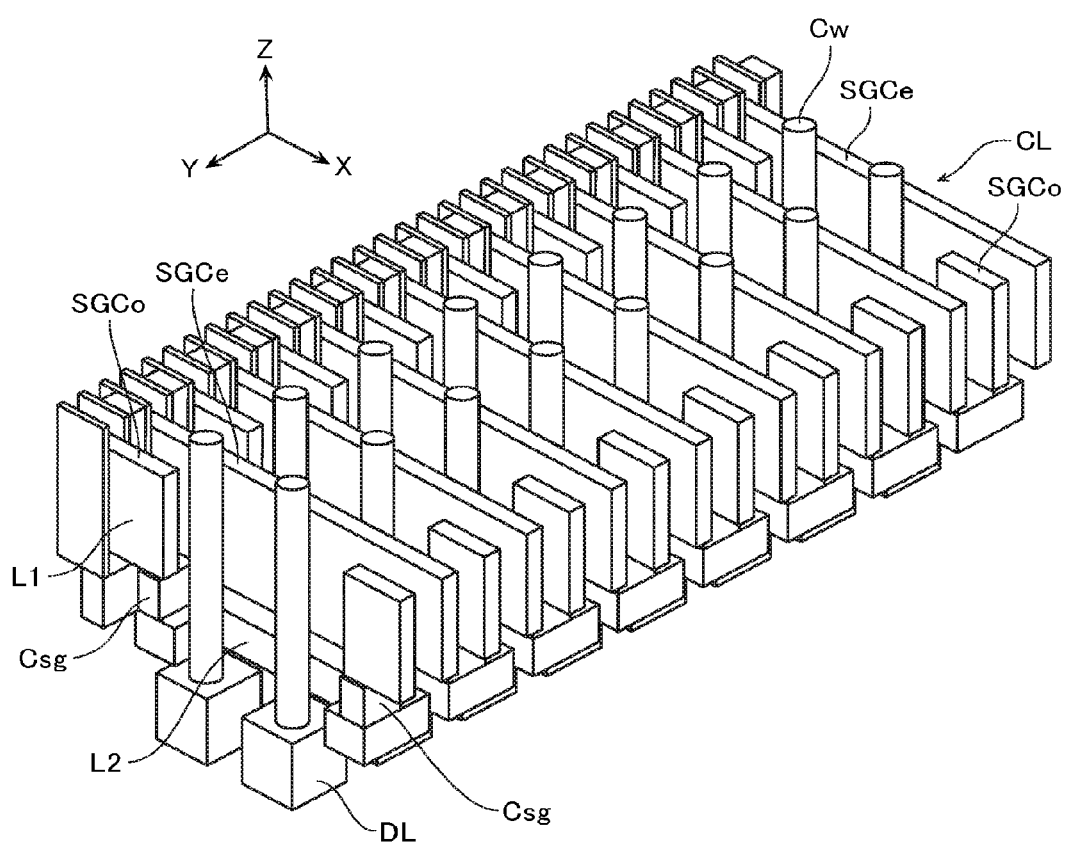
FIG. 11 is a perspective view showing the structure of the wiring line layer CL.

FIG. 7 is a perspective view selectively showing, in the wiring line layer CL a structure of select gate connecting wiring lines SGC connected to the select gate lines SG connected to the select transistors STr. FIG. 8 is a plan view of a portion of that select gate connecting wiring line SGC. In addition, FIGS. 9 and 10 are plan views that further break down the plan view of FIG. 8 on the basis of each of later-to-be-described layers. FIG. 11 is a perspective view that illustrates a contact Cw, in addition to the select gate connecting wiring line SGC.

As shown in FIGS. 7 and 8, the select gate connecting wiring line SGC is formed having the X direction as its longer direction, in the wiring line layer CL, similarly to the select gate line SG. However, one select gate connecting wiring line SGCe of the select gate connecting wiring lines SGC extends linearly in the X direction, while an adjacent select gate connecting wiring line SGCo adjacent to this one select gate connecting wiring line SGCe does not have a linear shape, but has a detour structure that detours below the select gate line SGCo. Due to this detour structure, an occupied area in an XY plane of the select gate connecting wiring line SGC becomes smaller in proportion to a detour below the adjacent select gate connecting wiring line, and the occupied area in the XY plane of the wiring line layer CL can be reduced. As a result of miniaturization of the wiring line layer CL, the semiconductor memory device overall can be miniaturized. In the case that all of the select gate connecting wiring lines SGC are configured in a linear shape, a lead area of such a select gate connecting wiring line SGC ends up increasing in order to form a contact to the select gate connecting wiring line SGC. However, the detour structure of the present embodiment makes it possible to reduce also the lead area and resultantly reduce the area of the wiring line layer CL, by a downward detour to the adjacent select gate connecting wiring line.

Note that in the example of FIG. 7, as an example, the select gate connecting wiring lines SGCo that are odd-numbered when viewed from a front side of FIG. 7 have the detour structure, and the select gate connecting wiring lines SGCe that are even-numbered when viewed from the front side of FIG. 7 have a linear shape. However, this is merely one example, and it is also possible that, conversely to FIG. 7, the even-numbered select gate connecting wiring lines SGCe have the detour structure, and the odd-numbered select gate connecting wiring lines SGCo have a linear shape. Moreover, there is no need for the linear-shaped select gate connecting wiring lines and the detour-structured select gate connecting wiring lines to be formed alternately one at a time, and there may exist a region where the linear-shaped select gate connecting wiring lines are successively formed. Conversely, there may exist a region where the detour-structured select gate connecting wiring lines are successively formed. In other words, it is sufficient that at least some of the select gate connecting wiring lines SGC include the detour-structured select gate connecting wiring line, and have a structure detouring to below the adjacent select gate connecting wiring line.

A structure of the select gate connecting wiring line SGCo having this detour structure will be described in detail with reference to FIGS. 9 and 10. FIG. 9 is a plan view of a wiring line positioned in the same layer as the select gate line SG; and FIG. 10 is a plan view of a wiring line of an identical layer to the global bit line GBL, which is one layer lower than the layer of FIG. 9.

As shown in FIG. 9, the select gate connecting wiring line SGCo having this detour structure includes a first portion L1 extending linearly in the X direction from the select gate line SG. Furthermore, the select gate connecting wiring line SGCo comprises: a contact portion Csg extending downwardly in the Z direction from one end of the first portion L1; and a second portion L2 connected to another end of the contact portion Csg and positioned in a lower layer than the first portion L1 (refer to FIG. 10).

As shown in FIG. 9, the first portion L1 extends having the X direction as its longer direction, similarly to the select gate connecting wiring line SGCe, but its length is shorter than a total length of the select gate connecting wiring line SGCe. An end portion of this first portion L1 is connected to an upper end portion of the contact portion Csg.

As shown in FIG. 10, the second portion L2 has a U-shaped shape and is connected to a lower end of the contact portion Csg at an end portion of the second portion L2. Note that at its other end portion, the second portion L2 is again connected to the first portion L1 via the contact portion Csg. Note that this second portion L2 can be formed by having the conductive layer 31 which is utilized also as the global bit line GBL, deposited also in the wiring line layer CL. That is, the second portion L2 can be formed in an identical layer to the global bit line GBL. Note that this second portion L2 is not limited to being U-shaped, and its shape is irrelevant under a limitation of at least including a portion that detours directly below an adjacent select gate connecting wiring line SGCe.

Note that in the illustrated example, the select gate connecting wiring line SGCo adopts a structure of being connected from the first portion L1, via the contact portion Csg, to the lower layer second portion L2, and furthermore of being connected at its other end to another contact portion Csg to again connect to the upper layer first portion L1. However, it is also possible that, instead of this, one of the first portions L1 is omitted, and the select gate connecting wiring line SGCo is connected to the contact portion Csg at another end of the second portion L2.

As described above, in the wiring line layer CL of the present embodiment, apart of some of a plurality of the select gate connecting wiring lines SGC has the above-mentioned kind of detour structure. As a result, adjacent two select gate connecting wiring lines SGC are arranged in a partially overlapping kind of form when viewed from the Z direction (in the XY plane). Therefore, a residual region (detour region) is generated in a portion of the detour structure, and another wiring line may be formed in this residual region. For example, as shown in FIG. 11, it becomes possible to form in the residual region a contact Cw extending upwardly in the Z direction from a diffusion layer DL formed in the transistor layer CML (the contact Cw is disposed so as to be included in this residual region). This contact Cw is, for example, a contact connected to the word line WL.

Figure 12:
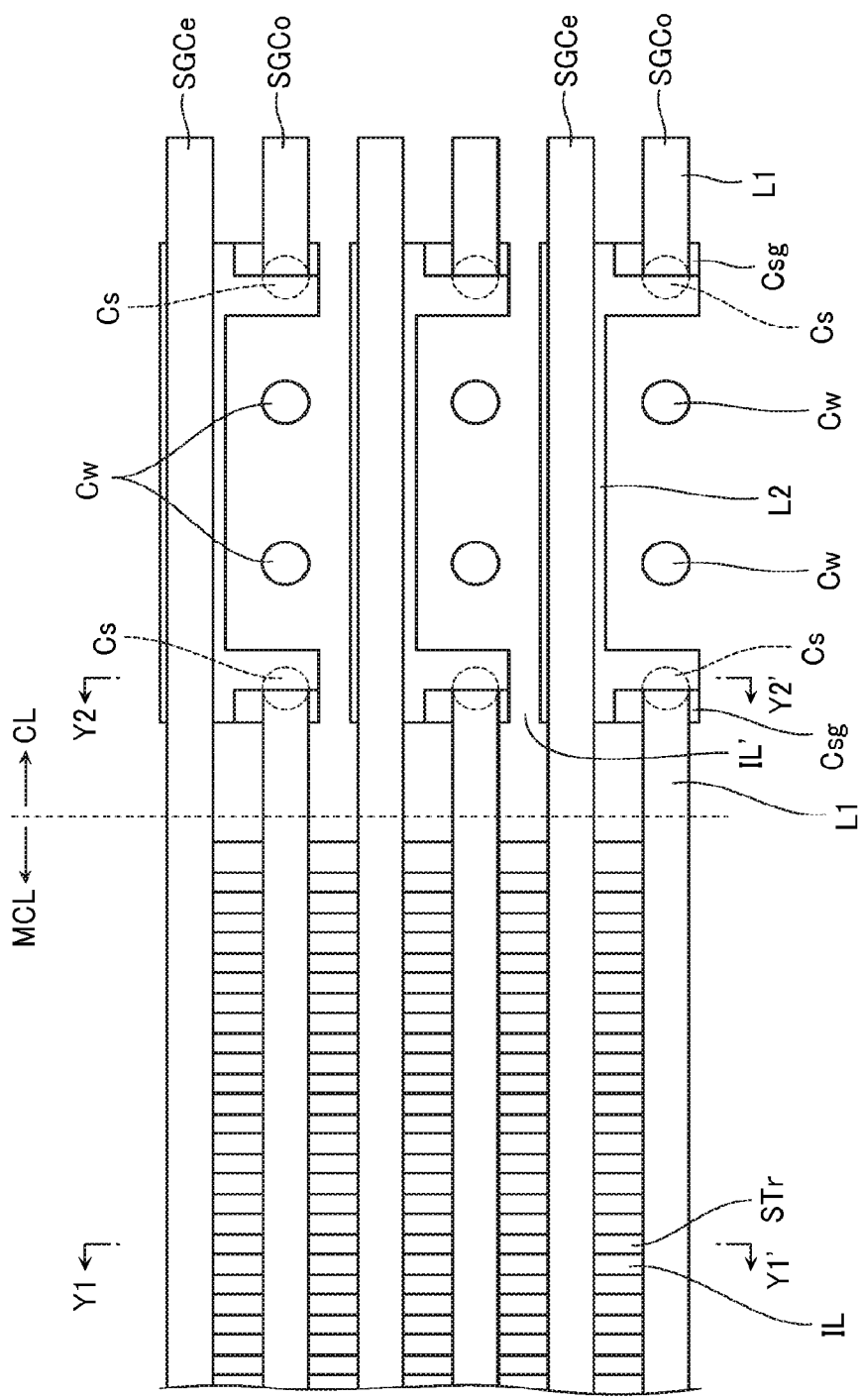
FIG. 12 is a plan view explaining a structure of a memory layer MCL and the wiring line layer CL.

As previously mentioned, the second portion L2 can be formed in an identical layer (at an identical height) to the global bit line GBL. This will be explained with reference to FIGS. 12 to 14. FIG. 12 shows a planar layout at a portion of the select gate line SG, of the memory layer MCL and the contact layer CL. Moreover, FIGS. 13 and 14 are cross-sectional views taken along the lines Y1-Y1' and Y2-Y2', respectively, of FIG. 12.

Figure 13:
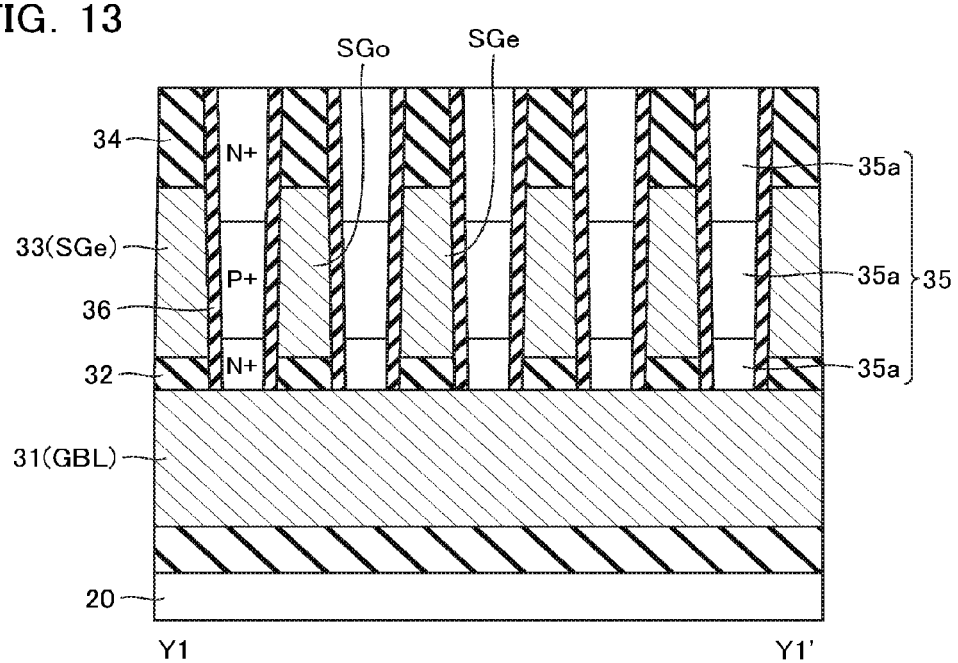
FIG. 13 is a cross-sectional view taken along the line Y1-Y1' of FIG. 12.

As shown in FIG. 13, in the Y1-Y1' cross-section in the memory layer MCL, the conductive layers 31 are arranged with a certain pitch in the X direction having the Y direction as their longer direction and act as the global bit lines GBL. Moreover, the conductive layers 33 functioning as the select gate lines SG (odd-numbered ones denoted as SGo and even-numbered ones denoted as SGe) are formed so as to extend having as their longer direction the X direction, that is, a direction perpendicular to a plane of paper of FIG. 13.

Figure 14:
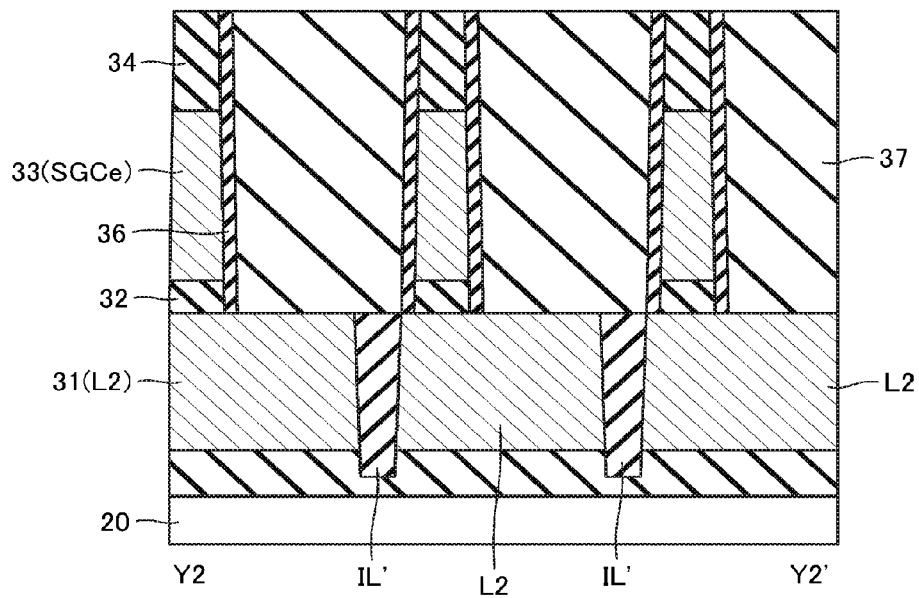
FIG. 14 is a cross-sectional view taken along the line Y2-Y2' of FIG. 12.

On the other hand, as shown in FIG. 14, in the Y2-Y2' cross-section of the wiring line layer CL, the select gate connecting wiring line SGCe extending linearly from the even-numbered select gate line SGe is formed so as to extend in the X direction, that is, the direction perpendicular to the plane of paper. On the other hand, the first portion L1 acting as the previously mentioned part of the select gate connecting wiring line SGCo extends in the X direction from the odd-numbered select gate line SGo, but the first portion L1 is discontinued short of the cross-section of FIG. 14 (an extended line of the first portion L1 is filled by the inter-layer insulating film 37 of FIG. 14). Instead, this first portion L1 is connected to the lower layer second portion L2 (conductive layer 31 of FIG. 14) by the contact Csg.

As shown in FIG. 12, the conductive layer 31 of this wiring line layer CL is formed in a U-shaped wiring line (second portion L2) in the XY plane. This U-shaped conductive layer 31 (second portion L2) is connected to the first portion L1 via the previously mentioned contact portion Csg. As shown in FIG. 14, a plurality of the second portions L2 (conductive layers 31) aligned in the Y direction are electrically divided by an insulating isolation film IL'.

The select gate connecting wiring line SGCo having the detour structure is connected to a contact Cs at the end portion of the U-shaped second portion L2. The contact Cs reaches the transistor layer CML to be electrically connected to a transistor in the transistor layer CML. The previously mentioned contact Cw can be arranged so as to be aligned in the X direction with this contact Cs (so as to be included in a region detoured by the U-shaped second portion L2). On the other hand, the select gate connecting wiring line SGCe having a linear shape may be connected to a contact at a portion not illustrated, or may be connected to a contact formed close to the illustrated contacts Cs and Cw.

As described above, due to the nonvolatile semiconductor memory device of the present embodiment, some of the select gate connecting wiring lines SGC have the detour structure that detours below other of the select gate connecting wiring lines SGC, hence another wiring line can be disposed in that detour portion. Therefore, the occupied area of the wiring line layer CL can be reduced, and as a result, the nonvolatile semiconductor memory device can be miniaturized.

[Second Embodiment]

Next, a nonvolatile semiconductor memory device according to a second embodiment will be described with reference to FIGS. 15 and 16. An overall configuration of the nonvolatile semiconductor memory device according to this second embodiment, a configuration of the memory cell array 11, and so on, are substantially identical to those of the first embodiment (FIGS. 1 to 6), hence duplicated descriptions thereof will be omitted. This second embodiment has a configuration of the wiring line layer CL that differs from that of the first embodiment.

Figure 15:
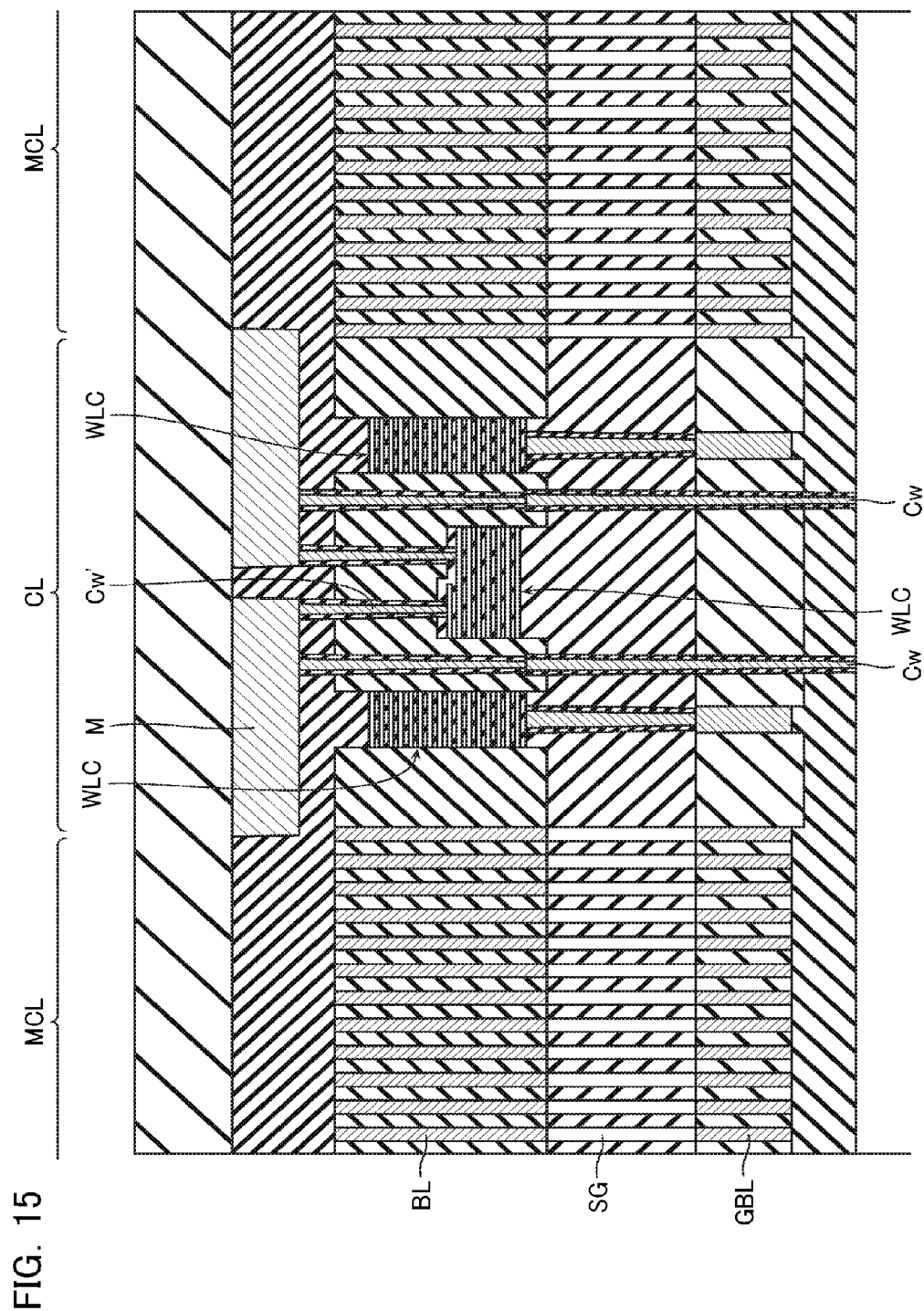
FIG. 15 is a cross-sectional view showing a configuration of a nonvolatile semiconductor memory device according to a second embodiment.
Figure 16:
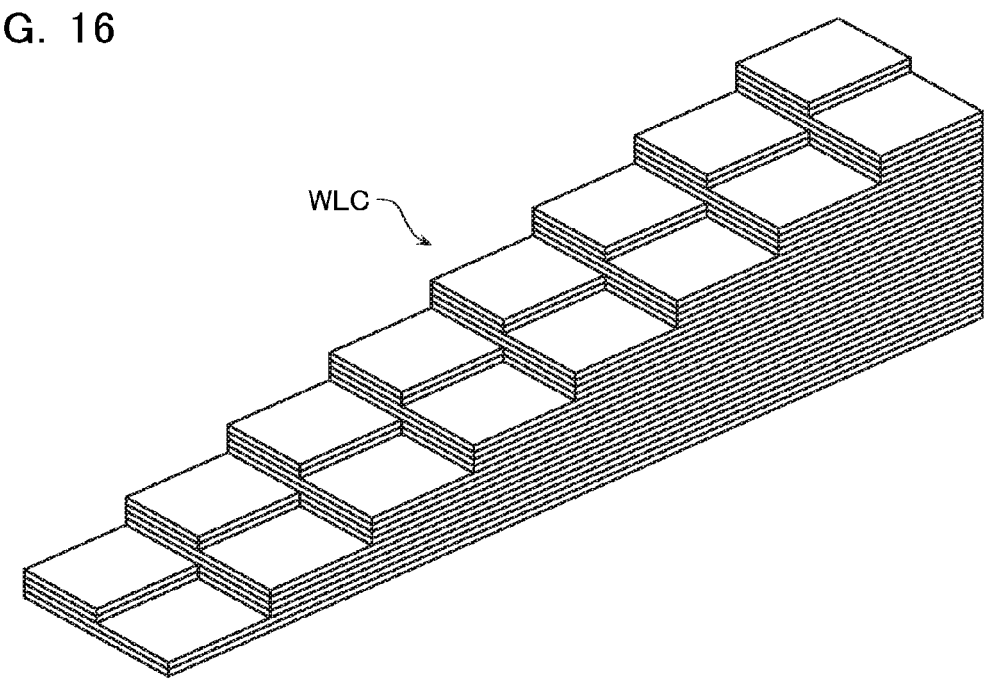
FIG. 16 is a schematic perspective view showing a configuration of a part of a contact layer CL of FIG. 16.

FIG. 15 is a cross-sectional view along the X direction of the nonvolatile semiconductor memory device according to the second embodiment. A structure of the memory layer MCL is identical to that of the first embodiment, hence a duplicated description thereof will be omitted. Moreover, in FIG. 15, although illustration thereof is omitted, a structure of a portion of the select gate connecting wiring line SGC is identical to that of the first embodiment, hence a description thereof will be omitted.

However, the wiring line layer CL of this second embodiment comprises a word line contact formation portion WLC connected to the word line WL in a higher layer than the select gate connecting wiring line SGC. As shown in FIG. 16, this word line contact formation portion WLC has a structure in which inter-layer insulating layers and conductive layers are stacked alternately and in which at least a part is formed in a stepped shape, and is formed in a layer above the previously mentioned select gate connecting wiring line SGC. The word line contact formation portion WLC is connected to a contact Cw' at an upper surface of a conductive layer of this portion formed in a stepped shape. An upper end of the contact Cw' is connected to an upper layer metal wiring line M formed in a layer above. Furthermore, the previously mentioned contact Cw is connected to this upper layer metal wiring line M. As a result, the word line WL is connected to the transistor layer CML via the word line contact formation portion WLC, the contact Cw', the upper layer metal wiring line M, and the contact Cw.

Such a stepped-shaped word line contact formation portion WLC can be formed by forming a stacked film in which conductive layers and inter-layer insulating films are alternately stacked, and then performing etching while gradually causing recession of a resist formed in a layer above the stacked film. After formation of the stepped-shaped word line contact formation portion WLC has finished, the word line contact formation portion WLC is once implanted with an inter-layer insulating film. Then, planarization processing is performed on this inter-layer insulating film, after which the contacts Cw and Cw' reaching this word line contact formation portion WLC and the transistor layer CML are formed by photolithography and etching. Finally, a barrier metal and a metal wiring line are deposited in a layer above the contacts Cw and Cw' to form the upper layer metal wiring line M, whereby a configuration of FIG. 15 is completed.

This second embodiment can also display identical advantages to those of the first embodiment. Moreover, the word line WL also can be connected by the word line contact formation portion WLC formed in a layer above the select gate connecting wiring line SGC, and a further reduction in area of the wiring line layer CL can be achieved.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
    a memory layer including a memory cell array;
    a transistor layer including a transistor, the transistor being included in a control circuit that controls the memory cell array; and
    a wiring line layer that connects the memory layer and the transistor layer,
    the memory cell array comprising:
    a plurality of first wiring lines arranged in a first direction perpendicular to a principal plane of a substrate;
    a plurality of second wiring lines that are configured so as to extend in the first direction and that intersect the plurality of first wiring lines;
    a plurality of memory cells disposed at intersections of the plurality of first wiring lines and the plurality of second wiring lines, one memory cell including a variable resistance element;
    a third wiring line extending in a second direction, the second direction intersecting the first direction;
    a select transistor connected between the second wiring line and the third wiring line; and
    a plurality of select gate lines connected to gates of a plurality of the select transistors aligned in a third direction, the third direction intersecting the first direction and the second direction,
    the wiring line layer comprising:
    a first connecting wiring line connected to a first select gate line of the plurality of select gate lines and extending in the third direction; and
    a second connecting wiring line connected to a second select gate line adjacent in the second direction to the first select gate line, and
    the second connecting wiring line comprising:
    a first portion extending in the third direction; and
    a second portion extending from the first portion to a layer below the first connecting wiring line.

2. The nonvolatile semiconductor memory device according to claim 1, wherein
    the second portion is formed in an identical layer to the third wiring line.

3. The nonvolatile semiconductor memory device according to claim 1, wherein
    the second portion has a U-shaped planar shape.

4. The nonvolatile semiconductor memory device according to claim 3, wherein
    the second portion is formed in an identical layer to the third wiring line.

5. The nonvolatile semiconductor memory device according to claim 1, wherein
    the wiring line layer comprises a contact extending in the first direction, and
    the contact is disposed in a region detoured by the second portion.

6. The nonvolatile semiconductor memory device according to claim 5, wherein
    the contact extends in the first direction from the transistor layer.

7. The nonvolatile semiconductor memory device according to claim 5, wherein
    the second portion has a U-shaped planar shape.

8. The nonvolatile semiconductor memory device according to claim 7, wherein
    the second portion is formed in an identical layer to the third wiring line.

9. The nonvolatile semiconductor memory device according to claim 1, further comprising:
    a contact electrically connected to the select gate line,
    wherein the contact is connected to an end portion of the second portion.

10. The nonvolatile semiconductor memory device according to claim 9, wherein
    the second portion has a U-shaped planar shape.

11. The nonvolatile semiconductor memory device according to claim 10, wherein
    the second portion is formed in an identical layer to the third wiring line.

12. The nonvolatile semiconductor memory device according to claim 1, wherein
    the wiring line layer further comprises a first wiring line contact formation portion extending from the plurality of first wiring lines to be formed in a stepped shape, and
    a contact is connected to the first wiring line contact formation portion.

13. The nonvolatile semiconductor memory device according to claim 12, wherein
    the second portion is formed in an identical layer to the third wiring line.

14. The nonvolatile semiconductor memory device according to claim 12, wherein
    the second portion has a U-shaped planar shape.

15. The nonvolatile semiconductor memory device according to claim 14, wherein
    the second portion is formed in an identical layer to the third wiring line.

16. The nonvolatile semiconductor memory device according to claim 1, further comprising:
    a third portion connecting the first portion and the second portion.

17. The nonvolatile semiconductor memory device according to claim 1, wherein
    the first connecting wiring line and the second connecting wiring line are arranged alternately in the second direction.

* * * * *